(12) United States Patent
McClelland et al.

(10) Patent No.: US 8,314,404 B2
(45) Date of Patent: Nov. 20, 2012

(54) DISTRIBUTED ION SOURCE ACCELERATION COLUMN

(75) Inventors: Jabez McClelland, Bethesda, MD (US); Brenton J. Knuffman, Montgomery Village, MD (US); Adam V. Steele, Rockville, MD (US); Jonathan H. Orloff, Rockaway Beach, OR (US)

(73) Assignees: FEI Company, Hillsboro, OR (US); The United States of America as represented by the Secretary of Commerce, The National Institute of Standards and Technology, Washington, DC (US)

( * ) Notice: Subject to any disclaimer, the term of this patent is extended or adjusted under 35 U.S.C. 154(b) by 122 days.

(21) Appl. No.: 12/886,354

(22) Filed: Sep. 20, 2010

(65) Prior Publication Data
US 2011/0210264 A1    Sep. 1, 2011

Related U.S. Application Data

(60) Provisional application No. 61/243,572, filed on Sep. 18, 2009.

(51) Int. Cl.
*H01J 27/00* (2006.01)
(52) U.S. Cl. ............ 250/423 R; 250/493.1; 250/492.1; 250/492.3; 313/359.1; 313/363.1

(58) Field of Classification Search .............. 250/423 R, 250/493.1, 492.1–492.3; 313/359.1, 361.1, 313/362.1, 363.1
See application file for complete search history.

(56) References Cited

U.S. PATENT DOCUMENTS

| | | | |
|---|---|---|---|
| 4,370,594 A | 1/1983 | Kuzenetzoff |
| 5,444,256 A | 8/1995 | Nagai et al. |
| 6,495,822 B2 | 12/2002 | Hirano et al. |
| 7,154,086 B2 | 12/2006 | Laprade |
| 7,709,807 B2 | 5/2010 | McClelland et al. |
| 2005/0092916 A1 | 5/2005 | Vestal et al. |
| 2005/0194544 A1 | 9/2005 | Vestal et al. |
| 2008/0296483 A1 | 12/2008 | McClelland et al. |
| 2009/0189083 A1 | 7/2009 | Godyak |

FOREIGN PATENT DOCUMENTS

| | | |
|---|---|---|
| WO | 2011035260 A2 | 3/2011 |
| WO | 2011035260 A4 | 3/2011 |

OTHER PUBLICATIONS

Hanssen, James L., et al., "Magneto-Optical-Trap-Based, High Brightness Ion Source for Use as a Nanoscale Probe," Nanoletters, 2008, pp. 2844-2850, vol. 8, No. 9.

*Primary Examiner* — Michael Maskell
(74) *Attorney, Agent, or Firm* — Scheinberg & Associates, PC; Michael O. Scheinberg

(57) ABSTRACT

An ion beam system uses a separate accelerating electrode, such as a resistive tube, to accelerate the ions while maintaining a low electric field at an extended, that is, distributed ion source, thereby improving resolution. A magneto-optical trap can be used as the ion source.

26 Claims, 7 Drawing Sheets

FIG. 9

DISTRIBUTED ION SOURCE ACCELERATION COLUMN

This application claims priority from U.S. Provisional Pat. App. No. 61/243,572, filed Sep. 18, 2009, which is hereby incorporated by reference.

TECHNICAL FIELD OF THE INVENTION

The present invention relates to charged particle beam systems and is particularly useful in an ion beam system that includes an extended ion source.

BACKGROUND OF THE INVENTION

For approximately 30 years, high resolution focused ion beams (FIBs) have proven useful for a variety of tasks such as microscopy, lithography, micromachining (ion milling and material deposition), and dopant implantation. Over the years, a number of ion sources have been developed for focused ion beam applications, including gas-phase field ionization, plasma, and liquid metals. Of all the sources developed to date, the liquid metal ion source (LMIS) has proven the most useful and is in the most widespread use today. The usefulness of the liquid metal ion source stems fundamentally from its very high brightness which allows the production of focused ion beams with spot sizes on the order of 10 nm while maintaining currents in the range of 1 pA to 10 pA. These characteristics give focused ion beams the necessary resolution and ion currents to perform a range of state of the art nanotechnology tasks.

Despite their widespread use, existing ion sources possess limitations that impede progress toward broader applications and higher resolution. Because of the need to wet a tungsten tip with a liquid metal, the number of different ionic species that can be implemented in a liquid metal ion source is somewhat limited. Ga is by far the predominant element used, though other species, including Au, Al, Be, and Cs, have been demonstrated. The liquid metal ion source also suffers from an extremely large energy spread, more than several eV, which is generally considered attributable to space charge effects occurring near the very small emission area on the surface of the emitter. This energy broadening leads to chromatic aberration in the focusing optics that form the focused ion beam, thereby limiting the achievable resolution and forcing a trade off between beam current and resolution. Gas phase field ionization sources address some of these problems in that they can operate with light elements and have a narrower energy spread, on the order of 1 eV, but the current is significantly less, they do not work with heavy elements, and they are more complicated to operate. Plasma sources also overcome some of the problems of the liquid metal ion source, but their brightness is orders of magnitude less than the other two sources. A further practical issue relevant to liquid metal and gas phase sources is that the nanometer scale effective source size, required for the existing sources to have high brightness, translates into a very acute sensitivity to source positional stability, which becomes an issue in the construction of a focused ion beam system.

Accordingly, a need exists for an improved system and strategy for generating ions, and particularly a focused ion beam that is suitable for a wide array of applications such as for example, site analyses, material deposition or implantation, ablation of materials, ion microscopy, secondary ion mass spectroscopy (SIMS), and ion nano-machining.

U.S. Pat. Pub. No. 2008/0296483 for "Magneto-optical Trap Ion Source" describes a magneto-optical trap ion source for a focused ion beam system. U.S. Pat. Pub. No. 2008/0296483 describes a system comprising a magneto-optical trap (MOT), an ionizing laser, and an extraction element. The magneto-optical trap produces a population or "cloud" of supercold neutral atoms. "Supercold" as used herein means cooler than 10 millikelvin. FIG. 1 shows schematically a typical MOT 100. Laser beams 102 slow the neutral atoms and electromagnets 104, which have currents flowing in opposite directions from each other, trap the neutral atoms in a cloud 106.

When the MOT is used as a source of ions in a magneto-optical trap ion source (MOTIS), an ionizing laser ionizes neutral atoms in the trap, and the ions are extracted by an electric field and accelerated in the form of an ion beam toward a target. The cold temperatures in the cloud yield an ion beam with excellent characteristics that theoretically allow for a beam resolution of 10 nm or less. The current produced from this source depends on the operating parameters of the magneto-optical trap and can range from single ions on demand to over 100 pA, a much wider range than is possible using conventional ion sources. In addition, the wide range of elements that can be laser cooled by use of a magneto-optical trap, greatly extends the type and range of ionic species that can be generated and focused into ion beams. FIG. 9 is a periodic table that shows which elements can be used in various types of ion sources.

It is difficult to accelerate ions from a non-point-like source without inducing a large energy spread in the resultant beam. The larger the spatial extent of the ion source, the more difficult it is to focus the ions to a point. Improvements in the system are required to produce smaller probe sizes and produce the resolution that such systems are theoretically capable of producing.

SUMMARY OF THE INVENTION

An object of the invention is to provide a method and apparatus for forming a focused charged particle beam, particularly to forming a focused ion beam from an extended ion source.

A preferred embodiment comprises an electrode configuration that creates an electrostatic potential to accelerate ions from a distributed source of ions to energies of up to tens of kilo-electronvolts (keV) while maintaining a low energy spread. The electrode configuration accelerates the ions over an extended distance. In some embodiments, the electrode configuration reduces electrostatic lensing, that is converging or diverging ions in the beam, so that ions leave the electrode substantially collimated. In other embodiments, the electrode configuration converges or diverges the beam, and can provide a long or short, positive or negative focal length, depending on what is required to optimize the resolution in a given application.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 9 is a periodic table labeled to show which elements can be readily used with different types of ion sources.

DETAILED DESCRIPTION OF PREFERRED EMBODIMENTS

Figure 1:
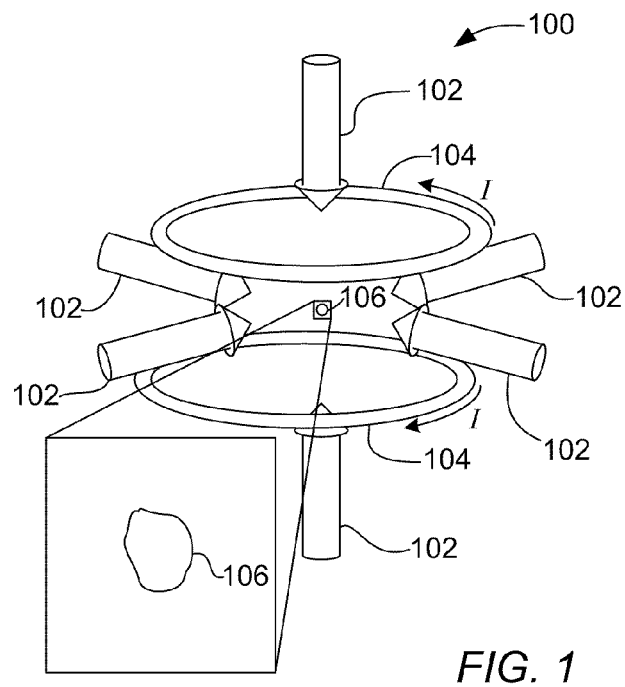
FIG. 1 shows schematically a prior art magneto-optical trap for neutral ions.

In a MOTIS, the ionizing laser can be directed parallel to the ion beam axis or normal to the axis. If the ionizing laser is oriented normal to the ion beam axis, the ions are created along a line normal to the beam axis and the distance of some of the ions from the optical axis makes it more difficult to focus from the ions to a point on the sample. If the ionizing laser is oriented along the beam axis, the ions are created along the optical axis, but because there is an electrical potential gradient across the cloud, ions created at different places in the trap will have different energies as they leave the trap. Ions having different energies will focus at different places, that is, the beam will exhibit chromatic aberration, enlarging the spot size at the target, thereby reducing resolution.

Because the charged ions repel each other, the ions will acquire velocity components normal to the beam axis which makes the ions increasingly difficult to focus at very small extraction fields. This mechanism sets a lower limit on the how far the energy spread and associated aberrations can be reduced by using a small electric field in the source region.

By maintaining a small electric field at the ion source, a small energy spread and high resolution can be obtained. However, if ions are to be accelerated to a few keV, as required in most focused ion beam applications, then a small field at the MOT will require either acceleration to occur over a long distance, or a stronger electric field along the beam path away from the source. If acceleration is to occur over a long distance using conventional electrostatic electrodes made from good conductors, then the area of these electrodes will have to be on the order of the square of the distance separating them in order to ensure field uniformity. This is not preferred because in many applications, the electrode structure would be impractically large. If, instead, the ions are accelerated over a smaller distance, then the beam will experience strong electrostatic lensing. If lensing induces the ions to come to a focus along the beam path before the target (a so-called 'cross-over') then inter-ion Coulomb forces will reduce the quality of the ion beam and again result in a larger spot size when the beam is re-focused. While having a cross-over is undesirable, it is an acceptable design compromise in some embodiments.

Embodiments of the invention address these problems and produce a high resolution beam from an extended ion source. Embodiments of the invention provide an electrode structure that extracts ions from source and accelerates the ions, preferably to several keV or 10 s of keV. In some embodiments, the ions coming from the source are preferably substantially collimated or parallel, that is, neither converging nor diverging.

Substantially collimated means that focal lengths greater than positive 250 mm or less than negative 250 mm are obtained while still accelerating the ions to 2000 eV. In other embodiments, focal lengths greater than positive 1000 mm or less than negative 1000 mm, or focal lengths greater than positive 10,000 mm or less than negative 10,000 mm, are obtained while accelerating an ion beam to 2000 eV. In other embodiments, the electrodes may act as a lens that more strongly diverges the beam before the final lens. In still other embodiments, the electrodes may act as a converging lens.

In some embodiments, improved resolution is achieved by providing a source electric field across the neutral atom cloud and an extension electric field that continues to accelerate the ions after they leave the region of the source. By making the extension electric field essentially equal to the source field, curvature of the equipotential lines can be reduced or eliminated, thereby reducing or eliminating lensing. By "essentially equal" is meant that the extension field strength is the same as the source field strength to within about 30 percent, more preferably about 20 percent, even more preferably with about 10 percent, and most preferably within about 5 or less percent.

In a preferred embodiment, the source of ions lies between two planar, preferably disk-shaped electrodes. The surfaces of these electrodes have a uniform potential applied across them. The disks have a sufficiently large diameter so that this potential, in turn, creates a uniform electric field that accelerates the ions towards one of the disks with a hole punched through it. The disk with the hole is referred to as the extractor electrode. The other disk is referred to as the source electrode. The region between the two disk electrodes is referred to as the source region. After passing through the hole the ions enter an extension field region, preferably created by a long tube-shaped resistive electrode. This electrode can comprise, for example, a tube made of doped glass that a finite, but with low conductivity, or an insulating tube having a preferably uniform resistive coating on its inner or outer surface. When an electrical potential is applied across the ends of the tube, the resistive coating provides a uniform electric field along the tube's length. The length of the tube is many times as large as the disk separation. In preferred embodiments, the tube length is more than 5 times the disk separation, more than 10 times the disk separation, more than 20 times the disk separate, or about 25 times the disk separation.

By maintaining a small, uniform electric field over the entire length of the device, a small energy spread in the source may be maintained and lensing is avoided. The use of a resistive element allows a uniform field to be created while keeping the electrode structure compact along the direction perpendicular to the beam's propagation. In another embodiment, a series of electrodes at gradually decreasing potentials are used to create an approximately uniform field with reduced lensing.

Charged particles are focused when an electric field is radially non-uniform, that is, the electric field along the optical axis is different from the off-axis electric field, so ions toward the edge of the beam are deflected differently from ions on the axis, making the off-axis ions converge or diverge. Focusing occurs, for example, by fringing effects around a hole in an electrode. The acceleration electrode reduces or eliminates the fringing by spreading the voltage drop over a greater distance and gradually reducing the potential to near that of the sample.

Thus, preferred embodiments can provide higher resolution than prior art system because of their ability to accelerate a distributed source of ions while simultaneously maintaining a low energy spread and, in some embodiments, avoiding a crossover. It may also find use in other ion beam systems where the source of ions is larger than a few hundred nanometers.

Preferred embodiments allow the acceleration of lithium ions to energies of up to 10 keV or more while maintaining beam collimation and a source energy spread less than 0.4 eV for a 10 μm ion source size.

Figure 2:
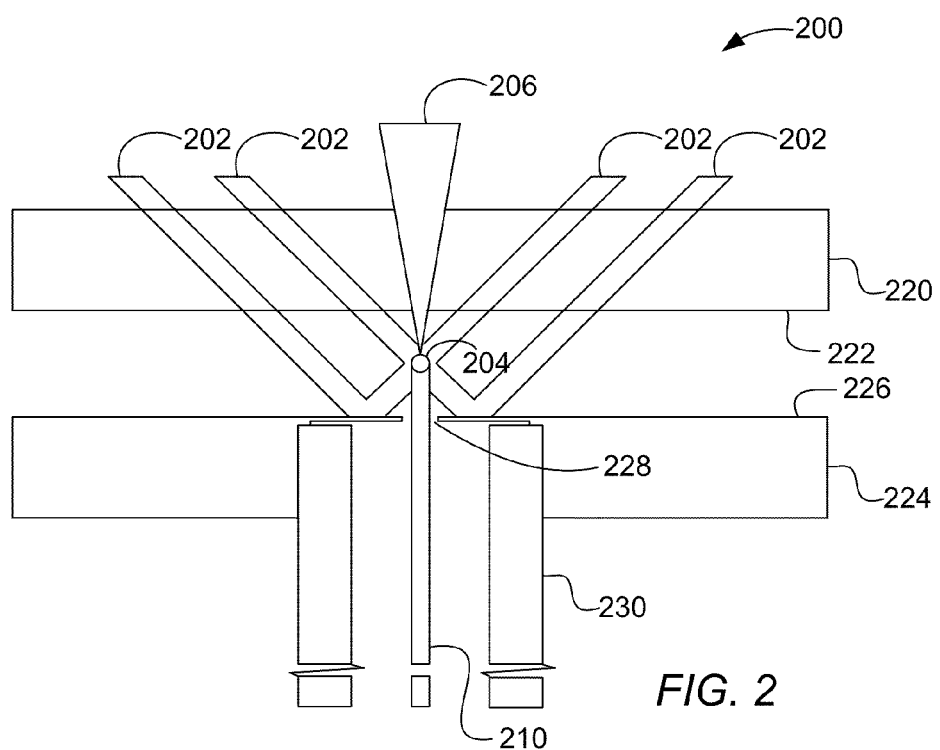
FIG. 2 shows a preferred embodiment of a magneto-optical ion source and electrodes of the present invention.

A schematic of the ion creation and acceleration regions of one embodiment of a MOTIS 200 is shown in FIG. 2. MOTIS 200 includes a MOT to capture and cool neutral atoms, such as chromium or lithium atoms, from an atomic beam. A MOTIS is describes in more detail, for example, in US. Pat. Pub. No. 2008/0296483, which is hereby incorporated by reference. A MOT is created by the intersection of the six laser beams 202 (4 shown, with unshown beams coming into and out of the page) and the zero of a quadrupolar magnetic field formed by a pair of oppositely oriented ring shaped strong permanent NdFeB magnets (not shown). In one embodiment, these magnets have an outer diameter of 75 mm and an inner diameter of 38 mm, a thickness of 25 mm and a $B_r$=1.3 T. When spaced by 215 mm these magnets produce gradients of 0.16 T m$^{-1}$ along the magnetization axis and 0.08 T m$^{-1}$ in the plane perpendicular to this axis.

Figure 3:
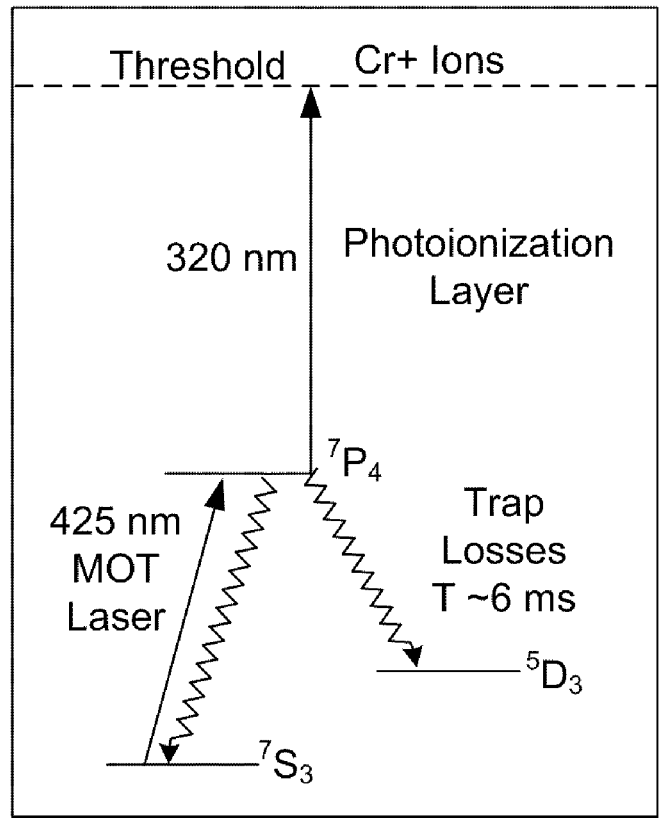
FIG. 3 shows the energy levels relevant to trapping and photoionizing chromium atoms.

The laser light is created by second harmonic generation of the output of a Ti:Sapphire laser (not shown), which is in turn pumped by a diode pumped solid-state laser (not shown). A few milliwatts in each of the 6 laser beams, which nominally have a 1/e$^2$ diameter of 4 mm, is sufficient to create the atom trap. The laser beams are tuned just below the electron energy transition level being used for cooling. FIG. 3 shows, for example, relevant energy levels in chromium for cooling and photoionization. When trapping chromium ions, the laser beams are tuned just below the $Cr^7S_3 \rightarrow {}^7P_4$ transition at 425 nm. A trapped cold chromium atom ensemble or cloud 204 is generally spherically symmetric and has an approximately Gaussian density profile with a standard deviation radius ranging from 50 μm to 500 μm, depending on magnetic field gradient and laser beam intensity, detuning and alignment. The temperature of the trapped atoms can be measured by turning off the laser light and allowing the atoms to freely expand for a time. The temperature inferred from the rate of expansion of the atomic distribution in one embodiment was 100±15 μK. An ionization laser beam 206 is focused through the MOT along the ion beam axis (axial ionization) and has an essentially Gaussian beam waist of standard deviation 5 μm (1/e$^2$ diameter of 20 μm).

The ions 210 are extracted in an electric field created by two parallel plates separated by 15 mm, a first plate, source electrode 220, consisting of a fused silica window with a transparent, conducting, coating 222, made from a material such as indium tin oxide (ITO). A second plate, extractor plate 224, comprises a silicon electrode about 100 μm thick and having a reflective aluminum coating 226. The extractor plate 224 has a hole 228 at the center through which the ions pass. The ions are accelerated to their final energy in an acceleration electrode, such as a resistive tube 230, the beginning of which is just below the interior surface of silicon electrode 224, and the far end of which is grounded. Resistive tubes are known and can be made, for example, using a doped glass or by providing a resistive coating on the inside of an insulating glass tube. A resistive tube electrode is described, for example, in U.S. Pat. No. 5,444,256 to Nagai et al. for an "Electrostatic Lens and Method for Producing the Same" and in U.S. Pat. No. 7,154,086 to Laprade for a "Conductive Tube for Use as a Reflectron Lens." In one embodiment for forming a chromium ion beam, tube 230 is about 265 mm long, with an outer diameter of about 25 mm and an inner diameter of about 125 mm. Hole 228 has a diameter of 4 mm and the end of tube 230 is positioned 0.4 mm below the interior surface of plate 224. In some embodiments, the proximal end of tube 230 may be electrically connected to the interior surface of plate 224. In other embodiments, the proximal end of tube 230 can be connected to a separate power supply.

In some embodiments, the voltages applied to source electrode 220, the extractor electrode 224, and the opposing ends of tube 230 are chosen so that the electric field in the resistive tube is the same as the uniform electric field between the source electrode 220 and the extractor electrode 224. Because the fields in these two regions are equal, and because the distance between the reflecting aluminum electrode and the start of the resistive tube is small, there is essentially no lensing as the ions pass from the region between the plates into the resistive tube. The ions do however experience a relatively weak diverging lens as they exit the resistive tube. In one embodiment, the free flight distance between the tube exit and the focusing optics is less than 100 mm. Therefore, the ion beam diameter at the focusing lens should be very close to that of the source width, which was typically set to 10 μm.

Acceleration of the ions is determined by the electrical potential difference between the region of the atom ensemble where the ion is created and the target. The distal end of the tube electrode is typically at the same potential as the target, that is, at ground potential, although the voltage applied to the distal end of the tube electrode may be different for different applications. Part of the voltage drop, and therefore the acceleration occurs between the source and extractor electrodes and part occurs between the extractor electrode and the distal end of tube 230. In one embodiment, the distance between the source and extractor electrodes, the length of the tube electrode, and the voltages applied to the electrode are adjusted to produce electric fields that result in the ions that leave the acceleration electrode being substantially collimated. Skilled persons can readily determine appropriate voltages and dimensions for a particular application by simulation, ray tracing, calculation, and experimentation.

In one application of the system geometry described above, the voltage between the source electrode 220 and the extraction electrode 226 is 100 V, so the ions, which are created on the average midway between the electrodes, emerge through hole 228 with an average energy of 50 eV. The voltage across the tube is, for example, 2000 V. The source electrode is then biased to 2100 V, so the voltage at the extractor electrode and the top of tube 230 is 2000 V, and the distal end of the tube 230 is grounded.

In a preferred embodiment, most of the ion acceleration occurs outside the extractor electrode and in the acceleration electrode. In some embodiments, more than 50%, more than 75%, more than 90%, more than 95%, or more than 97.5% of the acceleration occurs outside the extraction electrode.

Figure 4:
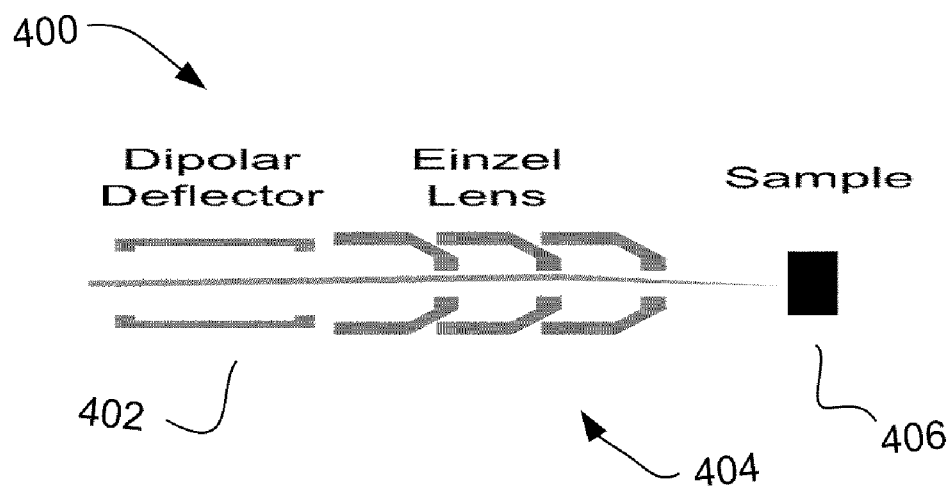
FIG. 4 shows parts of an ion optical column that deflects the ion beam and focuses it onto a sample.

FIG. 4 shows preferred focusing optics 400 are composed of three parts: a two-axis dipolar deflector 402, a three-element einzel lens 404, and a channel-electron multiplier 406 for secondary electron detection. There are preferably no beam-limiting apertures in the ion beam path. In one embodiment, the deflector plate voltage 402 is supplied by a fast amplifier with a range of 100 V and a settling time of 50 µs. The voltage range on the amplifier permits beam deflections from a few nanometers up to a few millimeters.

Figure 5:
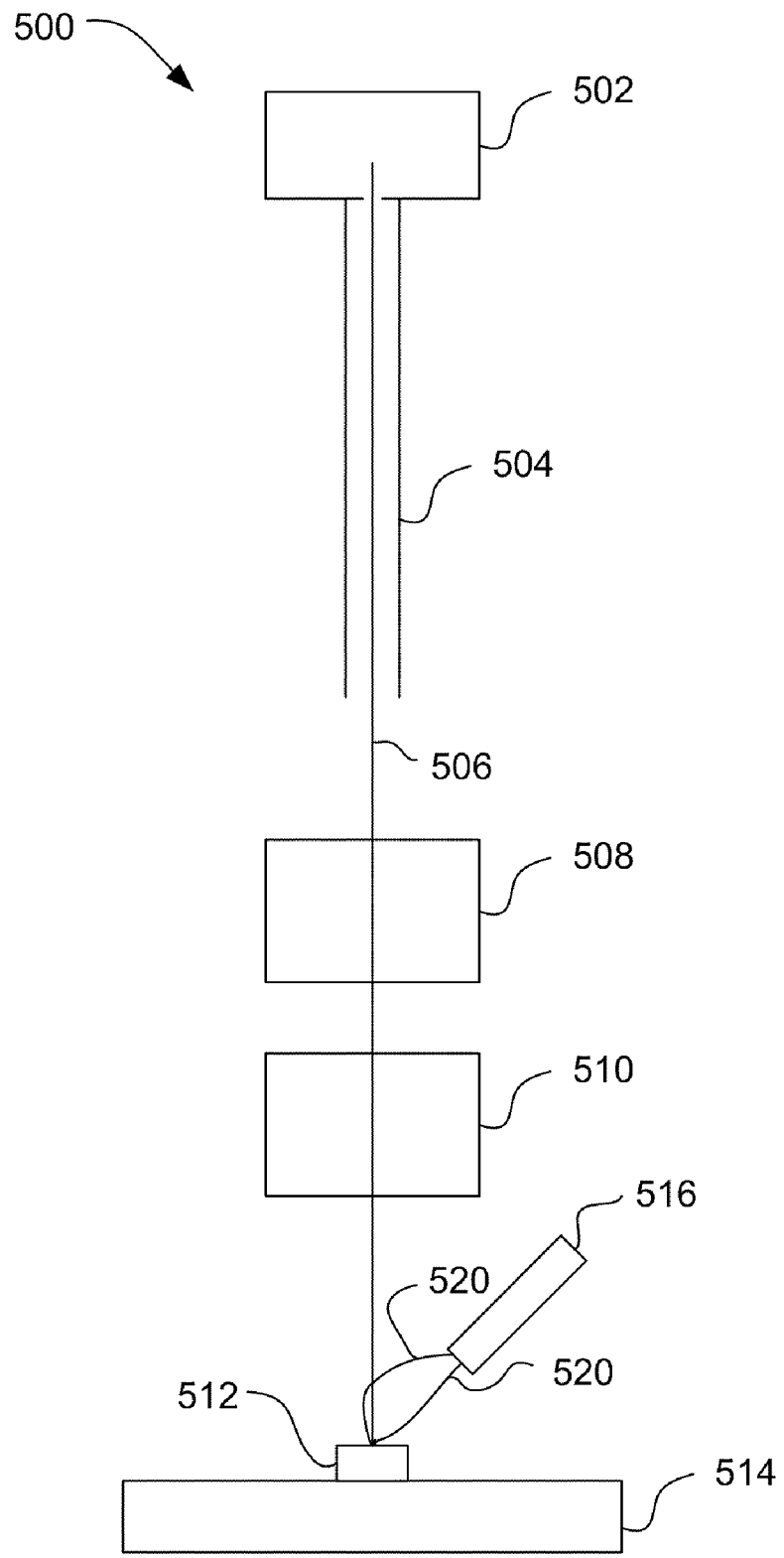
FIG. 5 shows a preferred ion column of the present invention that uses the source of FIG. 2 and the parts of the ion optical column in FIG. 4.

FIG. 5 shows schematically a focused ion beam system embodying the present invention. Ions are created in a supercold atom ensemble in a MOTIS 502 and are accelerated in acceleration electrode 504 to the desired energy for imaging or processing a target 512. Ion beam 506 emerges from the acceleration electrode 504 and is positioned and scanned on the target by deflector 508. Objective lens 510, preferably an electrostatic einzel lens, focuses the ion beam 506 onto the target 512, which is positioned on a sample stage 514, preferably a three-axis precision stage. Secondary charged particles 520, electrons and ions, are emitted from the target upon impact of the ion beam 506, and the secondary particles are detected by a particle detector 516, such as a scintillator-photomultiplier or a multichannel plate.

In one experiment, ions were either projected onto targets comprising a micro-channel plate and a phosphor screen at a working distance, defined as the distance from the closest surface of the lens to the target, of 28 mm, or onto a sample stage mounted at a working distance of 17 mm. Secondary ion counts from these targets were up to $2 \times 10^5$ s$^{-1}$ for a 0.2 pA ion beam.

Figure 6A:
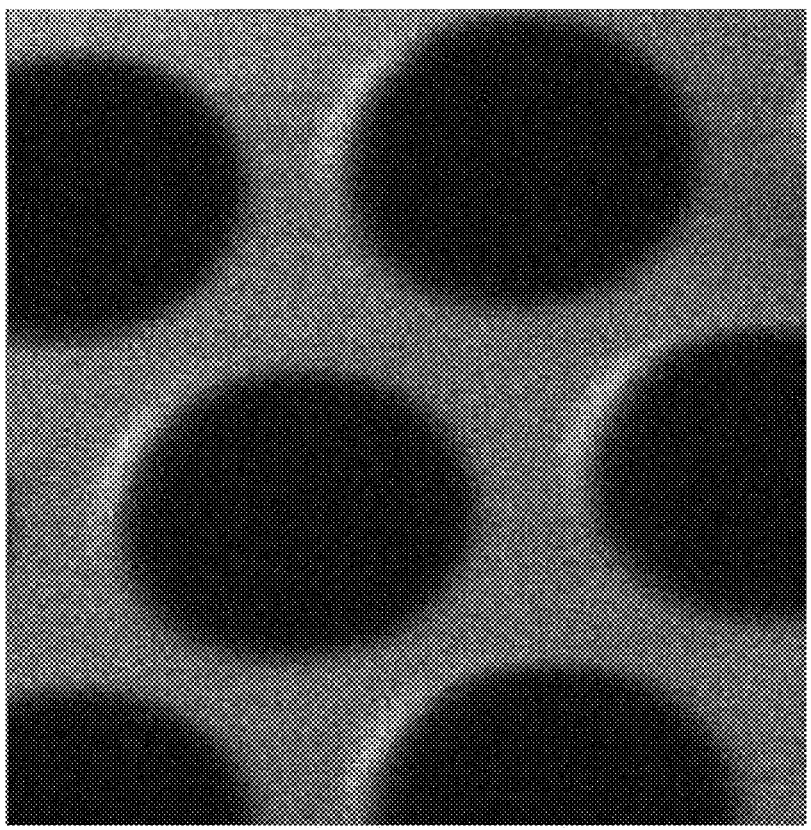
FIGS. 6A and 6B are photomicrographs taken using an embodiment of the invention using a chromium ion source.
Figure 6B:
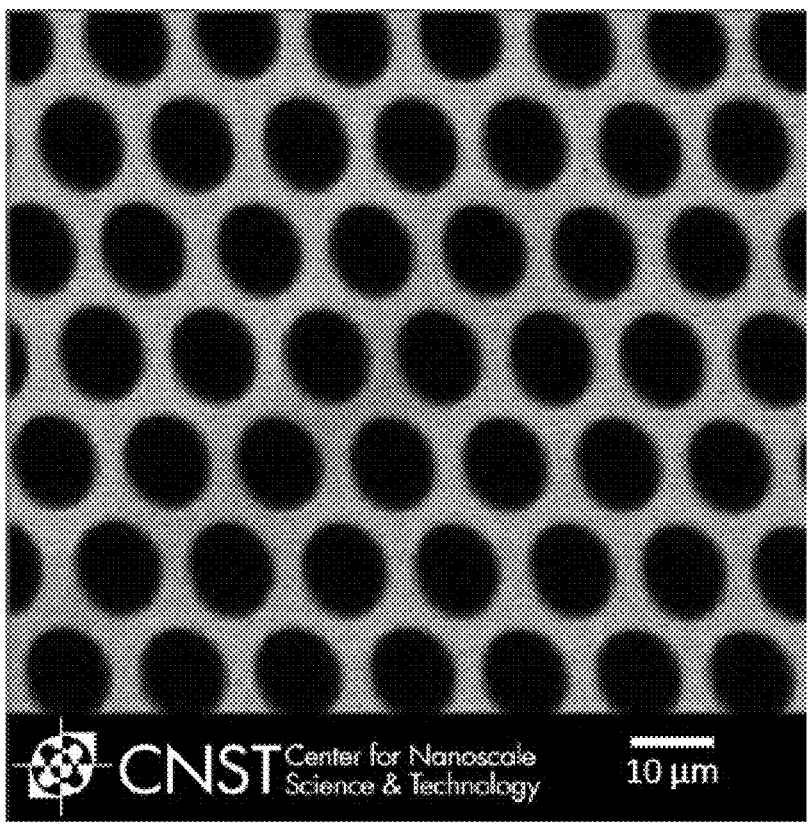
Figure 7A:
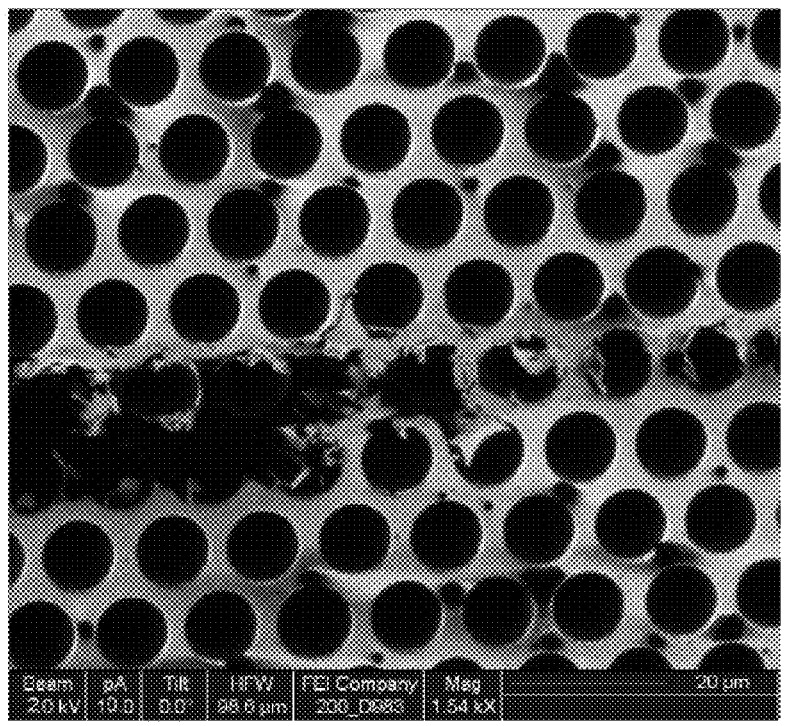
FIGS. 7A and 7B are photomicrographs taken using an embodiment of the invention using a lithium ion source.
Figure 7B:
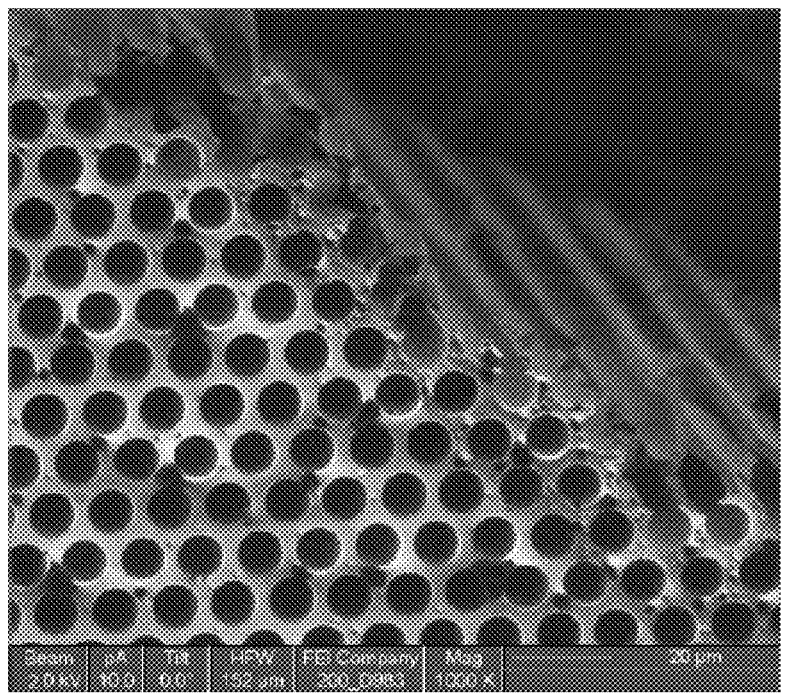
Figure 8:
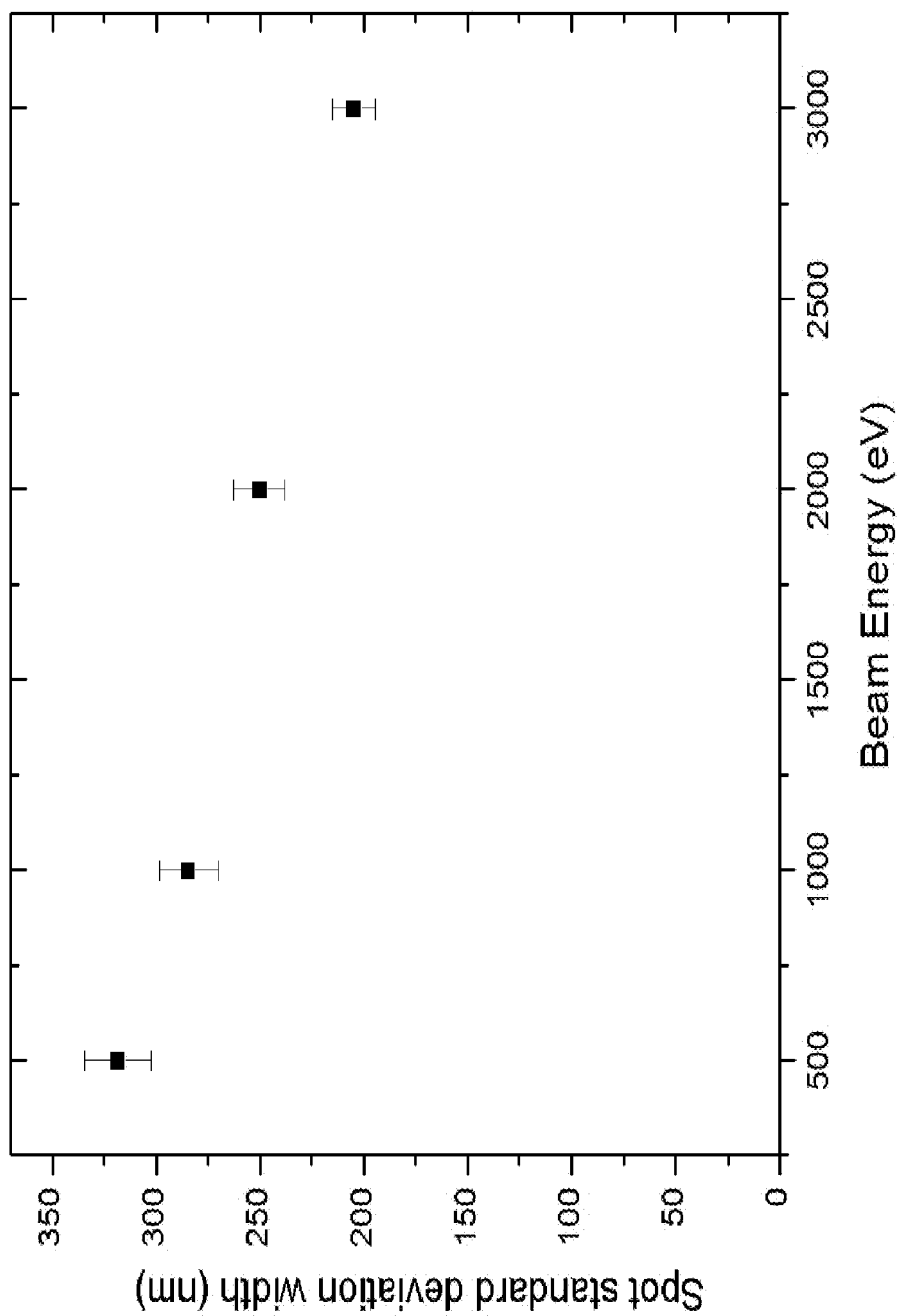
FIG. 8 is a graph showing the spot standard deviation width versus beam energy for an embodiment of the invention.

FIGS. 6A and 6B shows images formed at two different magnifications using a chromium ion beam of a microchannel plate with 10 µm pores an embodiment of the invention. The beam energy is 2 keV and the beam size is 250 nm. The image is 300×300 pixels and was acquired over 90 seconds. The 10 µm pores in the plate are clearly resolved, showing good resolution and contrast. FIGS. 7A and 7B shows images at two different magnifications of the plate created using lithium ion beams with 2 keV beam energy.

Figure 9:
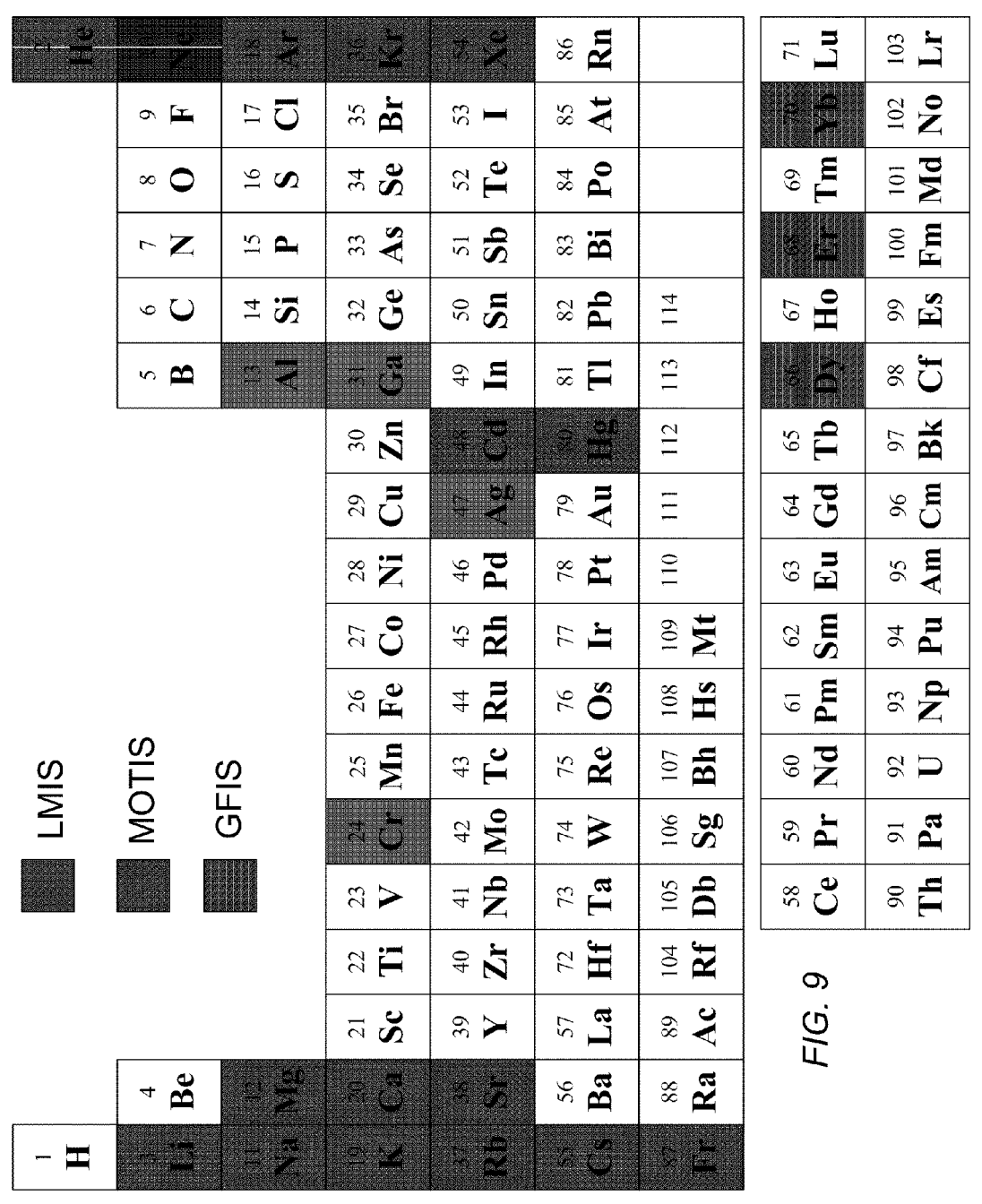

While the preferred embodiment described above uses a chromium source, other preferred embodiments use different types of ions. A MOTIS can use any of the elements indicated in FIG. 9 as having suitable electronic transitions for laser cooling, that is, elements that can be readily used in a MOTIS.

A lithium source is thought to be particularly useful for forming ion beam images. While the preferred embodiment described above uses a MOT source, the invention would be useful in other ion beam systems using an extended source, that is, a non-point source of ions, where the virtual source of ions is larger than a few hundred nanometers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An ion source for providing ions for a focused ion beam directed to a sample on a sample stage, comprising:
    a source region for containing supercold neutral atoms;
    a source electrode on one side of the source region;
    an extractor electrode on the opposite side of the source region from the source electrode, the extractor electrode having a hole, the source electrode and extractor electrode providing a source electric field having a source electric field strength across the source region;
    an energy source for ionizing at least some of the supercold neutral atoms to create ions, the ions being accelerated by the source electric field through the hole; and
    a resistive tube having different electrical potential along the tube for receiving ions from the hole in the extractor electrode and accelerating the ions.

2. The ion source of claim 1 in which one end of the resistive tube is at substantially the same electrical potential as the extractor electrode and in which the other end of the resistive tube is at substantially the same electrical potential as the target.

3. The ion source of claim 1 in which ions leaving the resistive tube are substantially collimated.

4. The ion source of claim 3 in which the extractor electrode and the resistive tube together converge or diverge the ions to provide a positive or negative ion focal length of magnitude greater than 250 mm.

5. The ion source of claim 3 in which the extractor electrode and the resistive tube together converge or diverge the ions or provide a positive or negative ion focal length of magnitude greater than 1000 mm.

6. The ion source of claim 1 in which ions are accelerated in the source region and further accelerated within the resistive tube, the change in energy of the ions caused by the electric field in the resistive tube being at least 10 times the change in energy caused by the electric field in the source region.

7. The ion source of claim 1, in which the source region includes a magneto-optical trap for slowing and trapping the neutral atoms.

8. The ion source of claim 1, in which the resistive tube extends from within 5 mm of the extractor electrode and in a direction away from the direction of source electrode.

9. The ion source of claim 1 in which the resistive tube comprises an insulating tube with a resistive coating.

10. The ion source of claim 1 in which the extractor electrode and the resistive tube together converge or diverge the ions or provide a positive or negative ion focal length of magnitude greater than 50 mm.

11. A focused ion beam system, comprising:
    an ion source of claim 1;
    deflection electrodes for deflecting the ion beam extracted from the source region; and
    a focusing lens for focusing the ion beam onto a sample on a sample holder.

12. The focused ion beam system of claim 11 in which no beam defining apertures are positioned between the extraction electrode and the sample holder.

13. An ion source for providing ions for a focused ion beam directed to a sample on a sample stage, comprising:
    a source region for containing supercold neutral atoms;
    a source electrode on one side of the source region;
    an extractor electrode on the opposite side of the source region from the source electrode, the extractor electrode having a hole, the source electrode and extractor electrode providing a source electric field having a source electric field strength across the source region;

an energy source for ionizing at least some of the supercold neutral atoms to create ions, the ions being accelerated by the source electric field through the hole;

at least one acceleration electrode providing an extension electric field extending from the extractor electrode with the hole, the strength of the extension electric field just beyond the hole differing from the strength of the source electric field by less than thirty percent, thereby reducing or eliminating focusing effects as ions leave the source region.

14. The ion source of claim 13, in which the source region includes a magneto-optical trap for slowing and trapping the neutral atoms.

15. The ion source of claim 13, in which one of the at least one acceleration electrode comprises a resistive tube that extends from near the extractor electrode and away from the source electrode.

16. The ion source of claim 15 in which the resistive tube comprises an insulating tube with a resistive coating.

17. The ion source of claim 15 in which the electrical potential at the end of the resistive tube closest to the extraction electrode differs by less than 20% from the electrical potential of the extraction electrode.

18. The ion source of claim 17 in which the end of the resistive tube closest to the extraction electrode is at about the same electrical potential as the extraction electrode.

19. The ion source of claim 15 in which the system further comprises an ion focusing lens for focusing the ion beam onto the sample and in which the electrical potential at the end of the resistive tube furthest from the extraction electrode is at approximately the same electrical potential as the sample.

20. The ion source of claim 15, in which the at least one acceleration electrode comprises a series of electrodes and further comprising a voltage source for supplying decreasing voltages to the electrodes in the series as the electrode gets further from the source region.

21. An ion source for providing ions for a focused ion beam directed to a sample on a sample stage, comprising:
a source region for providing ions;
one or more electrodes for providing an electrical potential at the extended source region;
an extractor electrode having a hole, the extractor electrode providing an electric field for extracting ions from the source region; and
an accelerating electrode having different electrical potentials at different points for receiving ions from the hole in the extractor electrode and accelerating the ions.

22. The ion source of claim 21 in which the accelerating electrode is a resistive tube.

23. The ion source of claim 22 in which ions leaving the resistive tube are substantially collimated.

24. The ion source of claim 22 in which ions leaving the resistive tube are diverging.

25. The ion source of claim 21 in which the accelerating electrode accelerates the ions over a distance greater than 5 times the size of the source region.

26. A focused ion beam system including an ion source in accordance with claim 21.

* * * * *